United States Patent
Huang

[19]

[11] Patent Number: 5,944,848
[45] Date of Patent: Aug. 31, 1999

[54] ERROR DECODING METHOD AND APPARATUS FOR REED-SOLOMON CODES

[75] Inventor: Wei-Hung Huang, Miaoli Hsien, Taiwan

[73] Assignee: United Microelectronics Corp., Hsinchu, Taiwan

[21] Appl. No.: 08/840,127

[22] Filed: Apr. 11, 1997

[30] Foreign Application Priority Data

Sep. 30, 1996 [TW] Taiwan ................................. 85111911

[51] Int. Cl.$^6$ ................................................. H03M 13/00
[52] U.S. Cl. ........................................... 714/784; 714/756
[58] Field of Search ................................ 371/37.11, 37.5, 371/39.1; 714/784, 756

[56] References Cited

U.S. PATENT DOCUMENTS 4,646,301 2/1987 Okamoto et al. ...................... 371/37.5
4,677,622 6/1987 Okamoto et al. ...................... 371/37.5
4,852,099 7/1989 Ozaki ..................................... 371/37.5

FOREIGN PATENT DOCUMENTS 0 156 413 A1 10/1985 European Pat. Off. .
2 269 034 1/1994 United Kingdom .

*Primary Examiner*—Emmanuel L. Moise
*Assistant Examiner*—Shelly A Chase
*Attorney, Agent, or Firm*—Rabin & Champagne, P.C.

[57] ABSTRACT

A method and an apparatus for performing error decoding on digital data using a Reed-Solomon code. The method decodes the value and location of errors and erasures on digital data defined as $RS_m(n,n-4)$ of the Reed-Solomon code by a series of arithmetic operations using multiplication-addition, inversion, shift-logarithm operations, and location determinations, but without power operation. Thus, the decoder requires less hardware. By these calculations the values and locations of errors and erasures on digital data are determined correctly and rapidly, avoiding Chien's search.

10 Claims, 3 Drawing Sheets

ERROR DECODING METHOD AND APPARATUS FOR REED-SOLOMON CODES

BACKGROUND OF THE INVENTION

1. Field of the Invention

The invention relates generally to a method and an apparatus for performing error decoding of digital data using Reed-Solomon codes. More particularly, the invention relates to a method and an apparatus for decoding the value and location of error words in digital data using Reed-Solomon codes by a series of product sum arithmetic operations, without a calculation of power.

2. Technical Background

Reed-Solomon (hereinbelow, abbreviated as RS) codes are very important in communication for the preservation of data, operating to continuously correct errors in bytes of digital data.

There are generally two different circuit types in the design of RS code decoders. One is the pipe-line type and the other is the processor-based program control type. Pipe-line type RS code decoders are typically used in systems that must work at high-speed and in real-time. Correspondingly, the circuitry for the pipe-line type RS code decoder is complex and expensive which is wasteful of resources and money in a system demanding only moderate speed. The RS code decoder of the processor-based program control type performs repeated calculations using an arithmetic logic unit (ALU), under the program control, which reduces the complexity and cost of the circuit of the RS code decoder. There are apparent differences between the pipe-line type and the processor-based program control type RS code decoders.

For RS codes, the calculations for decoding, when there are more than two errors among the transmitted words, are too complex to appropriately use the processor-based program control type of RS code decoder. However, the conventional system of this type for decoding two error words is used and is illustrated hereinafter:

An RS code can be defined as $RS_m(n, k)$. The input terminal of the RS code decoder receives n symbols, with each symbol consisting of m bits. After error correction, k data symbols are transmitted from the decoder.

$RS_m(n,k)$ can be defined as:

| | |
|---|---|
| $m$ | the number of bits of each imported symbol; |
| $n \leq (2^m - 1)$ | the code length of the RS codes; |
| $k$ | the number of information words in RS codes; |
| $d = n - k + 1$ | the Hamming distance in RS codes; and |
| $t = \left\lfloor \dfrac{d-1}{2} \right\rfloor$ | the maximum number of error words decoded by the decoder. |

Therefore, in an RS code decoder which can detect two error words, $t=2$, $d=2t+1=5$, $k=n+1-5=n-4$, and $RS_m(n,k)$ can be modified as $RS_m(n,n-4)$. For $RS_m(n,n-4)$ codes, the generating polynomial can be represented as:

$$g(x)=(x-1)(X-\alpha)(X-\alpha^2)(X-\alpha^3)$$

It may be assumed that in the n symbols there are v error words which are located at $l_1, l_2, l_3, l_4, \ldots, l_v$ and whose values are respectively $Y_1, Y_2, Y_3, Y_4, \ldots, Y_v$. In order to explain the principle of decoding the RS codes hereinafter, if the location $l_i$ is known before the n symbols are decoded, the error word is defined as an 'erasure', and if the location $l_i$ is unknown before the n symbols are decoded, the error word is defined as an 'error'.

With RS codes having a Hamming distance ($d=5$), p error words and q erasure words can be detected if p and q satisfy the following formula:

$$2p+q \leq d-1=5-1=4 \tag{1}$$

And if $X_i = \alpha^{l_i} 1 \leq i \leq v$, then the syndromes are:

$$S_v = \sum_{j=1}^{v} X_j^k Y_j \tag{2}$$

that is, the syndromes $S_0, S_1, S_2, S_3$ can be obtained with the respective combinations of $X_j$ and $Y_j$ where:

v: the number of erasure words and error words, $v=p+q$,
p: the number of error words,
q: the number of erasure words,
$X_j$: $X_j = \alpha^{l_j}$ and $l_j$ is the location of the jth error
$S_k$: syndrome,
$Y_j$: jth error value, and
d: Hamming distance of the code.

According to several U.S. Pat. Nos., for example, Ozaki (4,852,099) and Okamoto et al. (4,677,622), we know the following:

If $p=0$ and $q=4$, then:

If $p = 0$ and $q = 4$, then:

$$Y_4 = \frac{S_3 + (X_1 + X_2 + X_3)S_2 + (X_1 X_2 + X_2 X_3 + X_3 X_1)S_1 + X_1 X_2 X_3 S_0}{(X_4 + X_1)(X_4 + X_2)(X_3 + X_4)} \tag{3}$$

If $q = 3$ and $p = 0$, then:

$$Y_3 = \frac{S_2 + (X_1 + X_2)S_1 + X_1 X_2 S_0}{(X_3 + X_1)(X_3 + X_2)} \tag{4}$$

If $q = 2$ and $p = 0$, then:

$$Y_2 = \frac{S_1 + X_1 S_0}{X_2 + X_1} \tag{5}$$

If $q = 1$ and $p = 0$, then:

$$Y_1 = S_0 \tag{6}$$

When the number of erasure words q is from one to three, the number of error words p that can be accommodated becomes zero or one in accordance with Equation (1). To determine whether the actual value of p is zero, or one, or larger than one (in the situation that p is larger than one, the decoder cannot detect any error word from n symbols), reference must be made to a set of Forney Syndromes. If q is equal to one, then the Forney Syndromes are defined as:

$$T_1 = S_1 + S_0 X_1$$
$$T_2 = S_2 + S_1 X_2 \tag{7}$$
$$T_3 = S_3 + S_2 X_3$$

If q is equal to two, then the Forney Syndromes are defined as:

$$T_1 = S_2 + (X_1 + X_2) S_1 + X_1 X_2 S_0 \tag{8}$$

$T_2=S_3+(X_1+X_2) S_2+X_1X_2S_1$

If q is equal to three, then the Forney Syndromes are defined as:

$$T_1=S_3+(X_1+X_2+X_3) S_2+(X_1X_2+X_2X_3+X_3X_1) S_1+X_1X_2X_3S_0 \quad (9)$$

In the condition that q is equal to one or two, the value of p can be determined according to the rules below:

(1) If the Forney Syndromes are all equal to zero, the value of p is zero.

(2) If the Forney Syndromes are all not equal to zero, the value of p is one.

(3) If at least one of the Forney Syndromes is equal to zero and at least one of the Forney Syndromes is not equal to zero, the decoder cannot correct any error word from n symbols.

Further, when q is equal to three, if the Forney Syndrome is equal to zero, then the decoder can correct error words from n symbols. When q is equal to three, and if the Forney Syndrome is not equal to zero, then the decoder cannot correct errors from n symbols.

When p is equal to one, the locations of unknown error words can be determined with the equations below:

If $q = 1$ and $p = 1$, then $$X_2 = \frac{S_2 + S_1 X_1}{S_1 + S_0 X_1} \quad (10)$$

If $q = 2$ and $p = 1$, then $$X_3 = \frac{S_3 + S_2(X_1 + X_2) + S_1 X_1 X_2}{S_2 + S_1(X_1 + X_2) + S_0 X_1 X_2} \quad (11)$$

From the above Equations (3) to (11), the value of p can be determined only when the value of q is not equal to zero. In the situation that q is equal to zero, the value of p is determined by evaluating the following quantities:

$S_A=S_1S_1+S_0S_2$ $S_B=S_2S_2+S_1S_3 \quad (12)$ $S_C=S_0S_3+S_1S_2$ (1) If the three quantities are all equal to zero, then p is equal to one.

(2) If three quantities are all not equal to zero, then p is equal to two.

(3) If one or more of the quantities are equal to zero, and one or more of the quantities are not equal to zero, the decoder cannot correct the errors in n symbols. In situation (1), that is q=0 and p=1:

$$X_1 = \frac{S_1}{S_0} \quad (13)$$

In situation (2), that is q=0 and p=2:

$$X_1 + X_2 = \frac{S_0S_3 + S_1S_2}{S_1S_1 + S_0S_2} \quad (14)$$

$$X \cdot X = \frac{S_2S_2 + S_1S_3}{S_1S_1 + S_0S_2} \quad (15)$$

From Equation (3) to Equation (13), $X_i$ and $Y_i$ can be determined by three types of calculations, such as adding, multiplying and inverting, except in the case of (p,q)=(2,0). (When q is not equal to zero, under the condition that $i \leq q$, $X_i$ can be obtained while the n symbols are being imported, and the values of $Y_i$ and $l_i$ can be obtained with the additional calculation of a logarithm.)

Under the condition that p=2 and q=0, there are several ways to solve for the values of $X_1$ and $X_2$ with Equation (14) and Equation (15). For example, the conventional method is to perform a "Chien's Search". In the method using a Chien's Search, at first, $X_1$ is set to a predetermined value, and the value of $X_1+X_2$ is set as SUM. Thus, $X_2$=SUM−$X_1$ is obtained from Equation (14). Thereafter, $X_1$ and $X_2$ are substituted in Equation (15). If the value of the left side of the equation is not equal to the value of the right side, $X_1$ is set to another predetermined value, referring to the former value. By repeatedly setting the value of $X_1$, the value of $X_2$ can be obtained. But the speed of decoding is very slow for several repetitions of the calculation in which different values of $X_1$ and $X_2$ are substituted in the processor-based program control decoder. The method therefore has a negative influence on the whole system, and is not practicable for calculating the actual values of $X_1$ and $X_2$.

SUMMARY OF THE INVENTION

It is therefore an object of the invention to provide a method for performing error decoding of digital data using a Reed-Solomon code, that is useful to correctly and rapidly decode the values and locations of two errors in digital data defined as $RS_m$(n,n−4) of the Reed-Solomon code, by a series of product sum arithmetic operations, using addition, multiplication, division, shift-logarithm, and location.

It is another object of the invention to provide an apparatus for performing such a method of decoding.

This is accomplished in accordance with the invention by providing an error decoding method for decoding syndrome signals using Reed-Solomon codes, the Reed-Solomon codes being defined as $RS_m$(n,k), wherein m is a number of bits of each syndrome, n is a length of Reed-Solomon codes, and k is a length of information words in the Reed-Solomon codes, wherein the Reed-Solomon codes comprise p error words and q erasure words, $n \leq (2^m-1)$ and $2p+q \leq d-1$, and wherein d is the Hamming distance. The error decoding method includes decoding the error words and the erasure words existing in every syndrome signal and determining the numbers p and q.

Two equations $X_1^2=\alpha^{2l_1}$ and $X_2^2=\alpha^{2l_2}$ are evaluated for a calculation of location when there are two error words and no erasure words in every syndrome signal, wherein the syndrome signals having two errors are defined as:

$$S_k = \sum_{j=1}^{2} X_j^k Y_j \quad 0 \leq k \leq 3$$

wherein $X_1=\alpha^{l_1}$, $X_2=\alpha^{l_2}$, $l_1$ and $l_2$ define the locations of two error words, and $Y_1$ and $Y_2$ are values of the two error words:

$l_1$ and $l_2$ are evaluated by a calculation of the logarithm of $\alpha^{2l_1}$ and $\alpha^{2l_2}$ and a calculation of shifting; and $Y_1$ and $Y_2$ are obtained by a series of product/sum arithmetic calculations according to $X_1^2=\alpha^{2l_1}$, $X_2=\alpha^{2l_2}$.

In the above-mentioned error decoding method, when there are no erasure words in syndrome signals, the number p of error words can be determined by the three quantities $S_1S_1+S_0S_2$, $S_2S_2+S_1S_3$ and $S_0S_3+S_1S_2$. When none of the three quantities are equal to 0, then p is equal to 1. When all three quantities are equal to 0, then p is equal to 1. When at least one of the three quantities is equal to 0 and at least one of the three quantities are not equal to 0, then p is not determinable.

Furthermore, in the above-mentioned error decoding method, the calculation of location is performed by evaluating the following equation:

$$\alpha^i + \alpha^{-i} \to \alpha^i$$

$$1 \leq i \leq 2^m - 1$$

When there are two error words and no erasure words in every syndrome signal, then:

$$X_1 + X_2 = \frac{S_0 S_3 + S_1 S_2}{S_1 S_1 + S_0 S_2}$$

$$X_1 \cdot X_2 = \frac{S_2 S_2 + S_1 S_3}{S_1 S_1 + S_0 S_2}$$

Therefore, locations $l_1$ and $l_2$ of the error words can be determined by calculation of location according to the following equations:

$$X_1^2 = \alpha^{2l_1}$$

$$X_2^2 = \alpha^{2l_2}$$

and $l_1$ and $l_2$ determined as follows:

$$\alpha^i \to \begin{cases} i & \text{if not shift} \\ \frac{i}{2} & \text{if shift and } i \text{ is even} \\ \frac{i + (2^m - 1)}{2} = 2^{m-1} + \frac{i-1}{2} & \text{if shift and } i \text{ is odd} \end{cases}$$

Furthermore, the error decoding method according to the invention can be executed by providing an apparatus for decoding error words and erasure words existing in transmitted word signals, using Reed-Solomon codes provided from an external system. Such an apparatus would include a syndrome generator, to be coupled to the external system, for receiving the transmitted word signals therefrom and generating syndrome signals.

An erasure counter is to be coupled to the external system, for receiving the erasure words. An erasure counting value stored in the erasure counter is incremented by one each time that an erasure word is detected.

Registers are coupled to the syndrome generator, and to be coupled to the external system, for receiving the syndrome signals and the erasure words, and for storing the syndrome signals and the erasure words at predetermined locations. An arithmetic logic circuit (ALU) is coupled to the registers for reading the syndrome signals and the erasure words stored in the registers, and performing a predetermined operation in order to provide a feedback signal to the registers, and generate a deductive signal.

A comparator is coupled to the arithmetic logic circuit for receiving the deductive signal, performing a comparing operation, and then outputting a comparison signal. A program controller is coupled to the comparator and the erasure counter, for receiving the comparison signal from the comparator, reading the erasure counting value stored in the erasure counter, and outputting a program control signal. A program counter is coupled to the program controller for receiving the program control signal, in response to which it generates a program counting signal, and also outputs a feedback signal to the program controller. In response to receipt of the feedback signal, the program controller changes the program control signal.

An interpreter is coupled to the program counter to receive the program counting signal, and in response outputs a register address signal and an ALU enable signal. The arithmetic logic circuit (ALU) reads the syndrome signals and also reads the erasure words stored in the registers, according to the register address signal, in order to decode the error words in the transmitted word signals.

Moreover, the arithmetic logic circuit includes an inverter, a multiplier-adder circuit, a shift-logarithm circuit for performing shift and logarithm calculations and a locator for performing a location calculation. The inverter performs an inverting calculation on the syndrome signals and the multiplier-adder circuit performs an add calculation and a multiplication calculation on the syndrome signals. The shift-logarithm circuit performs a logarithmic calculation of the syndrome signals, and a shift calculation on the result of the logarithm calculation, according to the ALU enable signal. The locator performs a calculation of location.

The method is executed selectively in the arithmetic logic circuit by operating the inverter the multiplier-adder circuit, the shift-logarithm circuit, and the locator, in order to generate the feedback signal and the deductive signal.

BRIEF DESCRIPTION OF THE DRAWINGS

Other objects, features, and advantages of the invention will become apparent from the following detailed description of the preferred but non-limiting embodiment, with reference to the accompanying drawings in which.

DETAILED DESCRIPTION OF THE INVENTION

Figure 1:
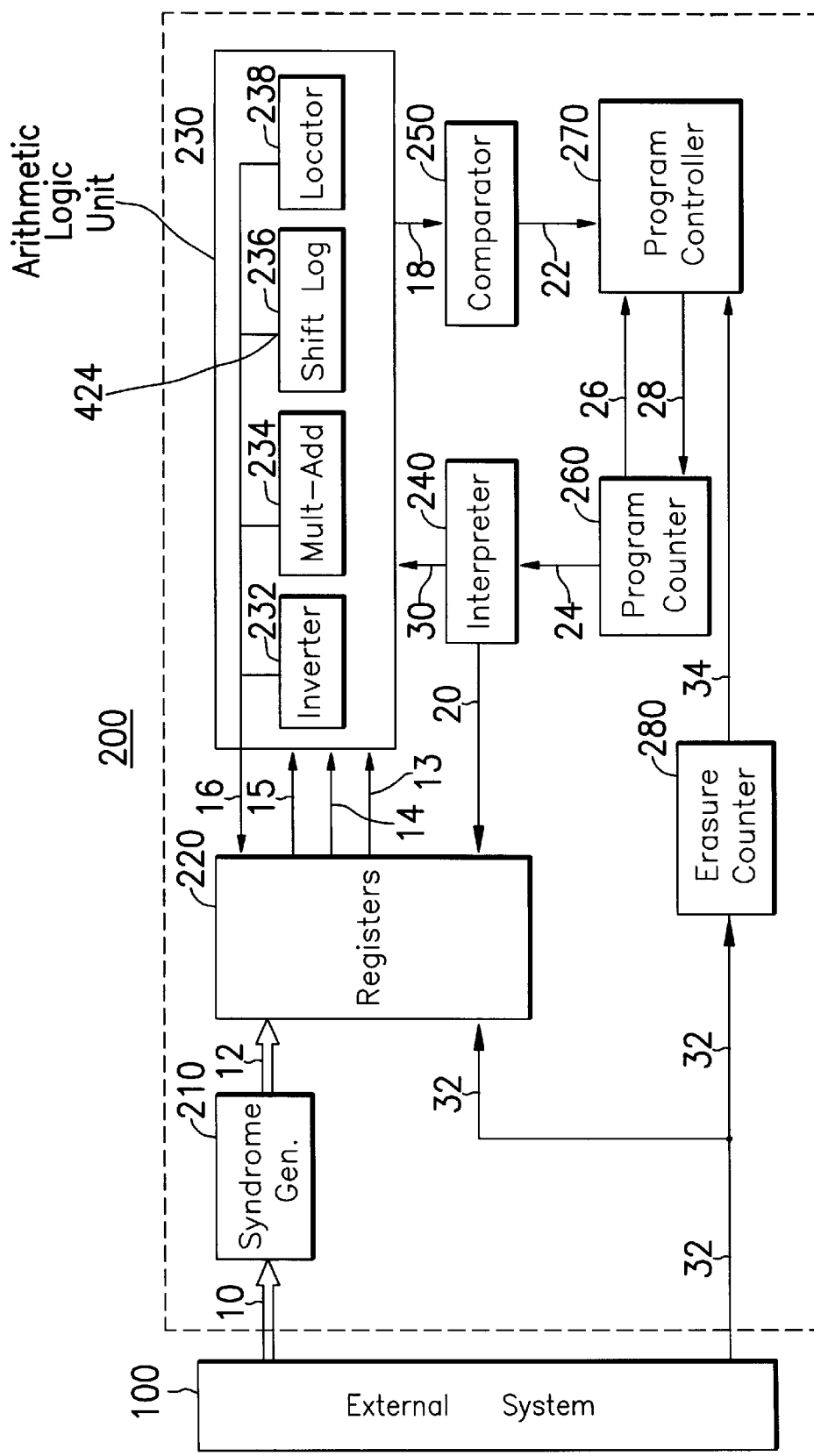
FIG. 1 is a circuit block diagram of the preferred embodiment of decoding apparatus according to invention.

Referring to FIG. 1, a decoding apparatus 200 according to the preferred embodiment of the invention comprises syndrome generator 210, registers 220, an arithmetic logic circuit 230, an interpreter 240, a comparator 250, a program counter 260, a program controller 270, and an erasure counter 280. The arithmetic logic circuit 230 includes an inverter 232, a multiplier-adder circuit 234, a shift-logarithm circuit 236, and a locator circuit 238.

When an external system 100 begins to transmit signals, transmitted word signals are transmitted to the syndrome generator 210 through a line 10, and erasure word signals are transmitted to the registers 220 and the erasure counter 280 through a line 32. The syndrome generator 210 generates syndrome signals from the transmitted word signals according to the format of RS codes. Syndrome signals are output to the registers 220 through a line 12. The registers 220 temporarily store every syndrome signal and erasure word signal in corresponding addresses in predetermined registers therein. Each time that the erasure counter 280 receives an erasure word signal via the line 32, an erasure counting value stored in the erasure counter 280 is incremented by one in order to count the sum of all erasure word signals. The erasure counting value is transmitted to the program controller 270 through a line 34.

When the apparatus 200 is enabled, the arithmetic logic circuit 230 receives syndrome signals and erasure word signals, which are stored in the registers 220, through the respective line 13, line 14, and line 15. After a series of selective calculations in the arithmetic logic circuit 230, a feedback signal is output to the registers 220 on line 16 where it is stored at a predetermined location. At the same time a deductive signal is output to the comparator 250 for a comparison calculation. Thereafter, a comparison signal is output to a program controller 270 on line 22.

Based on the output of the comparator 250, the erasure counting value from the erasure counter 280, and the program counting value stored in program counter 260, the program controller 270 determines whether the program address should jump or not, and if it should, to which address it should jump. Based on the determination, a program control signal is output from the program controller 270 to the program counter 260 through a line 28. A program counting signal is outputted to the interpreter 240 through a line 24 when the program counter 260 receives the program control signal. At the same time, the program counter 260 changes the program counting value, and then outputs the modified value as feedback to the program controller 270 on line 26 in order serve as a reference for the shifting of the program controller 270.

The interpreter 240 outputs register address signals on line 20 and an enable signal on line 30 respectively to the registers 220 and the arithmetic logic circuit 230 while receiving the program counting signal from the program counter 260. The arithmetic logic circuit 230 reads the values stored in correspondence with the register address signal, while receiving the enable signal. By the deductive function performed in the arithmetic logic circuit 230, the value and location of error words existing in transmitted word signals can be determined.

For the purpose of performing the deductive function, the arithmetic logic circuit 230 comprises the inverter 232, the multiplier-adder circuit 234, the shift-logarithm circuit 236 and the locator 238. The inverter 232 performs an inverting calculation on the ALU input value. The multiplier-adder circuit 234 performs an addition and multiplication calculation on the ALU input values. The shift-logarithm circuit 236 performs a logarithmic calculation on the ALU input values, and performs a shift calculation on the ALU input values based on the result of logarithm calculation, according to the enable signal. The locator 238, performs a calculation of location.

Figure 2:
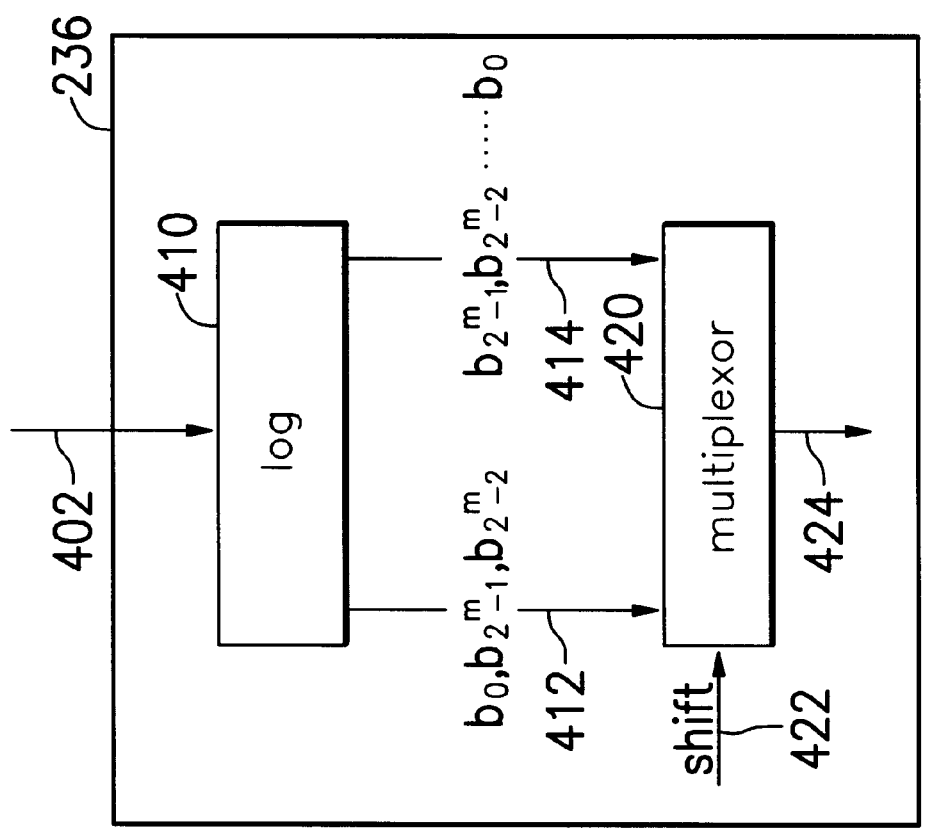
FIG. 2 is a circuit block diagram of the shift-logarithm circuit in the preferred embodiment.

Referring to FIG. 2, the shift-logarithm circuit 236 includes a logarithm calculator 410 and a multiplexer 420. When calculating data, for example, ALU input value is transmitted to the logarithm calculator 410 through a line 402, and shifted syndrome signals and unshifted syndrome signals are respectively output therefrom to the multiplexer 420 as, for example, $b_0, b_{2^m-1}, b_{2^m-2}, \ldots, b_1$ and $b_{2^m-1}, b_{2^m-2}, \ldots, b_0$ through lines 412 and 414. When the multiplexer 420 receives these signals and is enabled by the enable signal (shift) through line 422, the multiplexer 420 outputs the calculation result through line 424.

The shift-logarithm performed in the shift-logarithm circuit 236, is specified below:

$$\alpha^i \to \begin{cases} i & \text{if not shift} \quad (16) \\ \dfrac{i}{2} & \text{if shift and } i \text{ is even} \\ \dfrac{i+(2^m-1)}{2} = 2^{m-1} + \dfrac{i-1}{2} & \text{if shift and } i \text{ is odd} \end{cases}$$

The calculating method of location is:

$\alpha^i + \alpha^{-i} \to \alpha^{l_i}$ $1 \leq i \leq 2^{m-1}$ \hfill (17)

When word signals are transmitted, the apparatus 200 for decoding error words and erasure words performs some initial actions. That means, at first, the values stored in two of the registers 220 are respectively set as $\alpha^n$ and $\alpha^{-1}$, and these two registers are defined as $r_1$ and $r_2$. Therefore, the value of register $r_1$ is $\alpha^n$ and the value of register $r_2$ is $\alpha^{-1}$. When the first transmitted word signal is transmitted to the apparatus 200, the value of register $r_1$ is multiplied by $\alpha^{-1}$, and then the value of register $r_1$ is replaced with $r_1 \times \alpha^{-1}$. That means that if the syndrome signal is the Lth signal in transmitted data, the value of register $r_1$ is set to $\alpha^n \times \alpha^{-L}$. Whenever the erasure word signal is not logic "0", the value of $r_1$ is saved in some proper register of the registers 220. Then the definition $X_i = \alpha^{l_i}$ can be executed without the calculation of multi-powers, i.e., powers higher than 2. This procedure can reduce the complexity of the circuit.

Previously, an RS decoder was able to correct two errors with a processor-based program control structure, as noted above. However, a processor-based program control structure is not practical because the calculating formulas become very complex when an RS decoder must solve more than two errors. Therefore, a decoder which can correct two errors existing in RS codes accords with the real demands.

Errors and erasures can be corrected by the above Equations (3) to (10) when (p,q)=(0,1), (0,2), (0,3), (0,4), (1,1), or (1,2), but not for the situation p=2 and q=0. The errors also can be determined by Equation (13) when (p,q)=(1,0). The value of $(X_i, Y_i)$ can be determined by calculations above-mentioned of addition, subtraction and inversion and the value of location $l_i$, of $Y_i$ can also be determined.

The Equations (14) and (15) can also be solved when p=2 and q=0:

$$X_1 + X_2 = \frac{S_0 S_3 + S_1 S_2}{S_1 S_1 + S_0 S_2} \tag{14}$$

$$X_1 \cdot X_2 = \frac{S_2 S_2 + S_1 S_3}{S_1 S_1 + S_0 S_2} \tag{15}$$

According to conventional calculating methods, for example, a Chien Search is conducted, in which the calculating formulas are very complex and time consuming. The invention can decode the errors with the new calculating methods of location and shift-logarithm. Equation (14) divided by Equation (15) provides an Equation (17) as follows:

$$\frac{(X_1 + X_2)^2}{X_1 \cdot X_2} = \frac{X_1}{X_2} + \frac{X_2}{X_1} = \alpha^{(l_1 - l_2)} + \alpha^{-(l_1 - l_2)} \tag{18}$$

The calculating method of location is:

$\alpha^i + \alpha^{-i} \to \alpha^{l_i}$ $1 \leq i \leq 2^{m-1}$ \hfill (19)

The following equation is obtained by the method of location:

$$\alpha^{l_1-l_2} = X_1/X_2$$

$$1 \leq (l_1-l_2) \bmod (2^m-1) \leq 2^m-1 \quad (19)$$

Multiplying Equation (15) by Equation (19) provides the following equation:

$$X_1 \cdot X_2 \cdot \frac{X_2}{X_1} = X_2^2 = \alpha^{2l_2} \quad (19)$$

In the same way as by the shift-logarithm calculation of Equation (16), the value of $l_2$ is obtained.

With this method the values of $X_1^2$ and $X_2^2$ are obtained. In order to solve for the value of $Y_2$ by Equation (5), it is necessary to calculate according to the following:

$$i \rightarrow \alpha^i$$

in order to find out the values of $X_1$ and $X_2$.

Equation (5) is redefined in order to avoid the calculation of $\alpha^i$ from i and solve for the value $Y_2$:

$$Y_2 = \frac{S_2 \cdot X_1^2 \cdot S_0}{X_1^2 + X_2^2} \quad (20)$$

Figure 3:
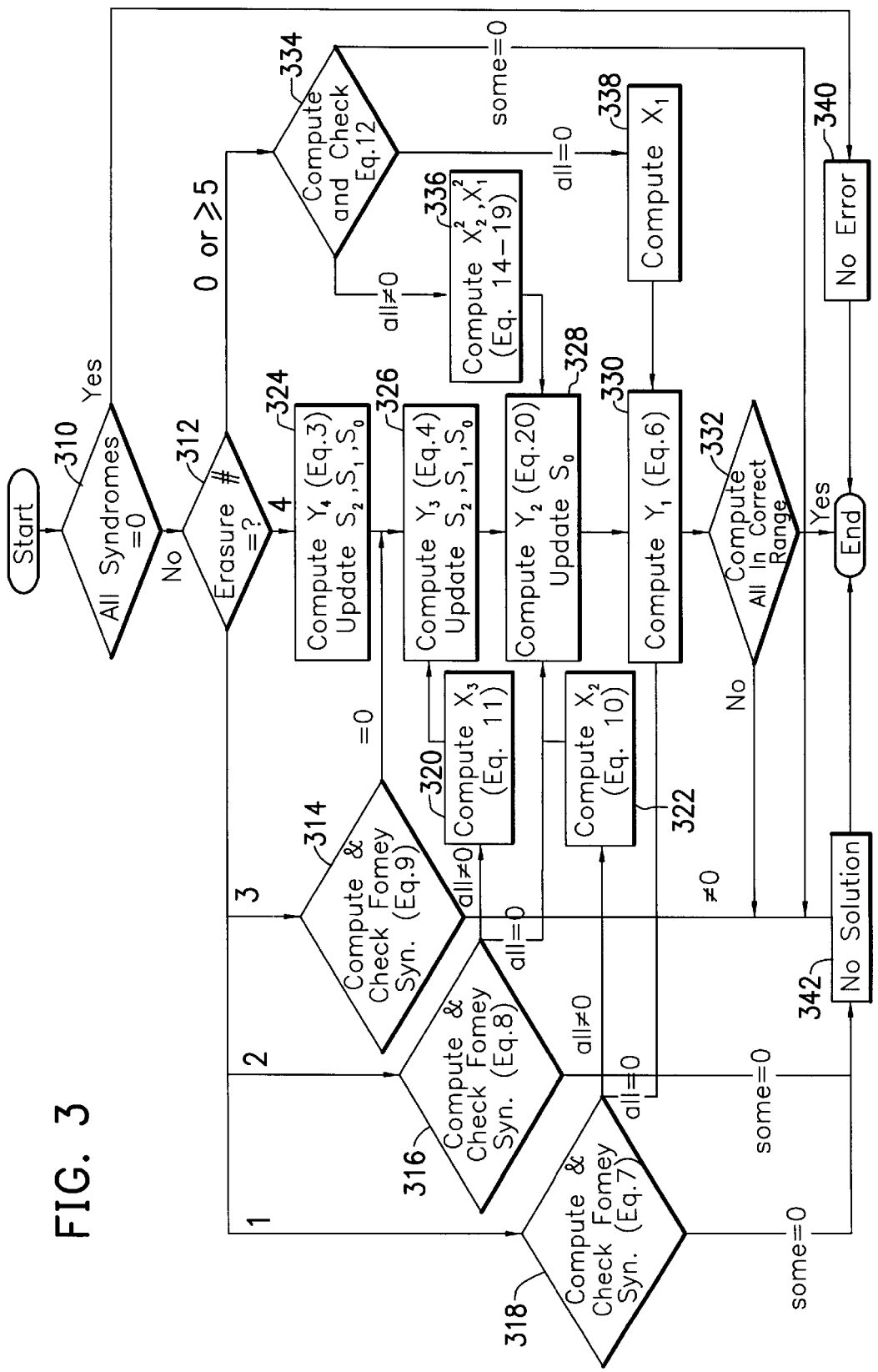
FIG. 3 is a flow chart of the preferred embodiment of decoding method according to invention.

Referring to the flow chart of FIG. 3, when all transmitted words have been input into the decoder if all syndrome signals are zero as determined in step 310, this of course means that the transmitted words have no error words, and in the following step, step 340, the decoding action is terminated. If all syndrome signals are not zero, then in a step 312 the erasure counting value stored in the erasure counter 280 is tested. If the erasure counting value is 1, 2 or 3, the flow branches to the left where a determination is made as to whether there is any error word or not using the Forney Syndrome formulas separately according to step 314, step 316, or step 318, respectively.

For example, in step 318, when the erasure counting value is equal to 1, the Forney Syndrome formulas of Equation (7) are evaluated. In step 316, when the erasure counting value is equal to 2, the Forney Syndrome formulas of Equation (8) are evaluated. In step 314, when erasure counting value is equal to 3, the Forney Syndrome formula of Equation (9) is evaluated. After one of the above-mentioned steps, the values of $X_i$, such as $X_3$ in step 320 and $X_2$ in step 322 are obtained.

When the erasure counting value is equal to 4, then in step 324 the value of $Y_4$ is obtained according to Equation (3) and the values of $S_2$, $S_1$, and $S_0$ are updated according to the value of $Y_4$. In step 326 the value of $Y_3$ is directly obtained according to Equation (4), and based on this value of $Y_3$ the values of $S_2$ and $S_0$ are updated. And then, in step 328, the value of $Y_2$ is obtained by Equation (20), and based on this value of $Y_2$ the value of $S_0$ is updated. Then in step 330, the value of $Y_1$ is obtained with the Equation (6).

The method of calculating the value of $Y_i$ is initiated by substitution of the maximum value 'i'. The calculated value $Y_{i(max)}$ may be taken as a known error word and that error word may be regarded as removed from the transmitted words. New values of $S_i$ are obtained by a method supplemented by Equation (2).

For example, if the value of $Y_4$ is known, then the new values of $S_i$ are:

$$S_0 \leftarrow S_0 + Y_4$$

$$S_1 \leftarrow S_0 + Y_4 X_4$$

$$S_2 \leftarrow S_2 + Y_4 X_4^2$$

Every value of $Y_i$ can be obtained corresponding to every $X_i$.

In the same way, when the erasure counting value is equal to 3, then when in step 314 the Forney Syndrome $T_1$ according to Equation (9) is computed and checked, if the result is not zero, which means that the errors cannot be decoded, this causes the termination of decoding in step 342. If the Syndrome $T_1$ is zero, then flow branches from decision step 314 and the values of $Y_1$, $Y_2$, and $Y_3$ are computed separately in step 326, step 328, and step 330 as already described.

When the erasure counting value is equal to 2, then in decision step 316 the values of the Forney Syndromes $T_1$ and $T_2$ are computed and checked according to Equation (8). If $T_1$ or $T_2$, but not both, are equal to zero, the flow is terminated in step 342. If $T_1$ and $T_2$ are both equal to zero, then the process flow branches and the values of $Y_1$ and $Y_2$ are obtained separately in step 328 and step 330, as previously described.

When the erasure counting value is equal to 1, decision step 318 is performed to compute and check Forney Syndrome Equations (7) for $T_1$, $T_2$ and $T_3$. If at least one, but not all of $T_1$, $T_2$ and $T_3$ are equal to zero, decoding cannot be performed, causing the termination of decoding through step 342. If $T_1$, $T_2$ and $T_3$ are all equal to zero, then the value of $Y_1$ is obtained in step 330 as previously described.

When the values $Y_i$ according to the series of steps above described are determined, the corresponding locations $l_i$ corresponding to $Y_i$ (the values of $l_i$ are obtained by the shift-logarithm operation on $X_i$ as described above). In the following step 332, a judgment is made as to whether $l_i$ is in the correct range or not. Because the sum of the inputted syndrome signals is n, the value of $l_i$ must be in the range from 0 to n−1. If $l_i$ is outside of the correct range decoding is not possible and is stopped at block 342.

When the erasure counting value is equal to 0, decoding can be completed in a manner similar to the steps described hereinbefore. Flow branches from decision block 312 to step 334 where the number of error words is computed according to Equation (12). When some, i.e., one or more, but not all of the quantities computed in equation (12), are equal to zero, the decoding is insolvable and the decoding is terminated at block 340. When none of the quantities computed with Equation (12) are equal to zero, that is p=2, the values of $X_1^2$ and $X_2^2$ according to equations 14–19, and then $Y_2$ are computed and $S_0$ is updated, in steps 336 and 328 respectively. When the quantities computed with equation (12) are all equal to zero, that is p=1, the value of $X_1$ is computed in step 338, and the value of $Y_1$ is computed in step 330. The test in step 332 is then performed to check for the correct range, as previously described.

In conclusion, the invention provides a new method of decoding of RS codes whose Hamming distance is equal to 5, by using the program to control sharing of information in the processing-based structure, and by using the calculation of location to avoid the redundant calculation of a Chien's Search. It is important that the arithmetic logic circuit thus becomes very simple without the need for the calculation of powers. Only the following four kinds of calculations are required:

Inverting calculation: $a \rightarrow 1/a$

Multiplication-addition calculation: $a,b,c \rightarrow a \cdot b+c$

Shift-logarithm calculation: referring to Equation (16)

Location calculation: referring to Equation (17)

With regard to a shortened RS code, $n \neq 2^m$, the hardware of the shift-logarithm circuit and locator in the arithmetic logic circuit 230 can be simplified even further. At first the shift-logarithm circuit can calculate the value of $l_i$ using $X_i$ and $X_i^2$. This is meaningful only when $l_i$ is in the range from 0 to n−1, and decoding cannot be completed when $l_i$ is outside of the range. Therefore, the logarithm table (not shown) in the shift-logarithm circuit 236 of FIG. 1 corresponds only from 0 to $2^{n-1}$. If the inputted value is outside of the valid range, the shift-logarithm circuit outputs an error flag.

Regarding the locator 238, because $(l_2-l_2)$ is in the range from 1 to n−1 (when $l_1 > l_2$), according to Equation (17), the output value of the locator 238 must be in the range from 1 to $2^{m-1}$. Therefore, the calculation of location can be executed in the range from 1 to Max ($2^{m-1}$, n−1). If the value is outside of this range, an error flag is output to show that the decoder cannot correct any error words, that is, the code is insolvable.

Therefore, in the preferred embodiment with the decoder detecting RS codes whose Hamming distance is 5, the calculation of powers is not required. This permits a simplification of the arithmetic logic circuit. It does not have to repeatedly execute complex calculations when there are two error words and there is no erasure word. Therefore, the decoding speed is increased. Moreover, the invention provides a great improvement in fields concerning the decoding of RS codes.

While the invention has been described by way of example and in terms of a preferred embodiment, it is to be understood that the invention is not limited to the disclosed embodiment. To the contrary, it is intended to cover various modifications and similar arrangements. Therefore, the scope of the appended claims should be accorded the broadest interpretation so as to encompass all such modifications and similar arrangements.

What is claimed is:

1. An error decoding method for decoding syndrome signals using Reed-Solomon codes, the Reed-Solomon codes being defined as $RS_m(n,k)$, wherein m is a number of bits of each syndrome signal, n is a length of the Reed-Solomon codes, k is a length of information words in the Reed-Solomon codes, and the Reed-Solomon codes comprise p error words and q erasure words, and wherein $n \leq (2^m-1)$ and $2p+q \leq d-1$, and d is a Hamming distance of the Reed-Solomon codes, the error decoding method comprising the steps of:

(a) decoding the syndromes, obtaining therefrom the error words and the erasure words existing in each of the syndromes signal and determining the number of p and q for each of the syndromes;

(b) obtaining first and second error locations from the equations $X_1^2 = \alpha^{2l_1}$ and $X_2^2 = \alpha^{2l_2}$ by a calculation of location when there are two error words and no erasure words in every one of the syndromes, wherein the syndromes having two errors are defined as:

$$S_k = \sum_{j=0}^{2} X_j^k Y_j \quad 0 \leq k \leq 3$$

wherein $X_1 = \alpha^{l_1}$, $X_2 = \alpha^{l_2}$, $l_1$ and $l_2$ define the locations of the two error words, $Y_1$ and $Y_2$ are values of the two error words;

(c) obtaining $l_1$ and $l_2$ according to $\alpha^{2l_1}$ and $\alpha^{2l_2}$ by performing logarithm and shift operations; and (d) obtaining $Y_1$ and $Y_2$ by performing a series of product sum arithmetic operations according to $X_2^2 = \alpha^{2l_2}$, $X_2^2 = \alpha^{2l_2}$.

2. The error decoding method as claimed in claim 1, further comprising:

determining values $S_A$, $S_B$ and $S_C$ by evaluating the following three equalities when there are no erasure words in the syndromes:

$$S_A = S_1 S_1 + S_0 S_2$$

$$S_B = S_2 S_2 + S_1 S_3$$

$$S_C = S_3 S_3 + S_1 S_2;$$

and then:

determining p to be equal to 1 when $S_A$, $S_B$, $S_C$ are all equal to 0, determining p to be equal to 2 when none of $S_A$, $S_B$, $S_C$ are equal to 0, and determining that p is not determinable when only one or two of $S_A$, $S_B$, $S_C$ are equal to 0.

3. The error decoding method as claimed in claim 1, wherein step (b) includes calculating location according to the following:

$$\alpha^i + \alpha^{-i} \to i$$

$$1 \leq i \leq 2^{m-1}.$$

4. The error decoding method as claimed in claim 3, wherein when p=2 and q=0, step (b) includes evaluating:

$$X_1 + X_2 = \frac{S_0 S_3 + S_1 S_2}{S_1 S_1 + S_0 S_2}$$

$$X_1 \cdot X_2 = \frac{S_2 S_2 + S_1 S_3}{S_1 S_1 + S_0 S_2}.$$

5. The error decoding method as claimed in claim 4, wherein step (c) includes obtaining $l_1$ and $l_2$ to determine the locations of the error words by evaluating the following:

$$X_1^2 = \alpha^{2l_1}$$

$$X_2^2 = \alpha^{2l_2}.$$

6. The error decoding method as claimed in claim 5, wherein step (c) further includes evaluating the following:

$$\alpha \to \begin{cases} i & \text{if not shift} \\ \dfrac{i}{2} & \text{if shift and } i \text{ is even} \\ \dfrac{i+(2^m-1)}{2} = 2^{m-1} + \dfrac{i-1}{2} & \text{if shift and } i \text{ is odd.} \end{cases}$$

7. The error decoding method as claimed in claim 6, wherein step (d) includes obtaining the values of the two error words $Y_1$ and $Y_2$ by evaluating the following:

$$Y_2 = \frac{S_2 + X_1^2 \cdot S_0}{X_1^2 + X_2^2}$$

$$S_0 \leftarrow S_0 + Y_1$$

-continued $$Y_1 = S_0.$$

8. An apparatus for decoding error words and erasure words existing in transmitted word signals using Reed-Solomon codes from an external system, comprising:

(a) a syndrome generator, for receiving the transmitted word signals from the external system and generating syndrome signals;

(b) an erasure counter for receiving the erasure words from the external system and incrementing by one an erasure counting value stored in the erasure counter each time an erasure word is received;

(c) register means, coupled to the syndrome generator for receiving syndrome signals from the syndrome generator and having an input for receiving the erasure bits from the external system, for storing the syndrome signals and the erasure bits in predefined locations thereof;

(d) arithmetic logic means, coupled to the register means, for reading the values stored in the registers means, performing a predefined operation to generate a first feedback signal and a deductive signal, and providing the first feedback signal to the register means;

(e) a comparator, coupled to the arithmetic logic means, for receiving the deductive signal and performing a comparison operation to generate a comparative signal;

(f) a program controller, coupled to the comparator and the erasure counter, for receiving the comparative signal from the comparator and reading the erasure counting value stored in the erasure counter, and for outputting a program control signal;

(g) a program counter, coupled to the program controller, and responsive to the program control signal, for generating a program counting signal and a second feedback signal, and outputting the second feedback signal to the program controller, whereby the program controller is responsive to the second feedback signal to selectively change the program control signal; and (h) an interpreter, coupled to the program counter and responsive to the program counting signal, for generating a register address signal and an enable signal, the interpreter being coupled to the register means for providing the register address signal thereto, and coupled to the arithmetic logic means for providing the enable signal thereto, the arithmetic logic means being responsive to the enable signal for reading the syndrome signals and the erasure words stored in the register means, according to the register address signal, in order to decode the error words in the transmitted word signals.

9. The apparatus as claimed in claim 8, wherein the arithmetic logic means includes:

an inverter for performing an inverting calculation on the syndrome signals;

multiplier-adder means, for performing an add calculation and a multiplication calculation on the syndrome signals;

shift-logarithm means, for performing a logarithmic calculation on the syndrome signal, and for performing a shift calculation on a result of the logarithmic calculation, according to the enable signal; and locator means for performing a calculation of location.

10. The apparatus as claimed in claim 9, wherein the predefined operation is executed selectively by operating the inverter, the multiplier-adder means, the shift-logarithm means, and the locator means, in the arithmetic logic means in order to generate the first feedback algorithm signal and the deductive signal.

* * * * *